US012804802B2

(12) United States Patent
Zhou et al.

(10) Patent No.: US 12,804,802 B2
(45) Date of Patent: Nov. 17, 2026

(54) PHASE SHIFTER

(71) Applicant: Suzhou Luxshare Technology Co., Ltd., Suzhou City (CN)

(72) Inventors: Zhengguo Zhou, Suzhou City (CN); Chengyu Xu, Suzhou City (CN); Wanqiang Zhang, Suzhou City (CN)

(73) Assignee: SUZHOU LUXSHARE TECHNOLOGY CO., LTD., Suzhou City (CN)

( * ) Notice: Subject to any disclaimer, the term of this patent is extended or adjusted under 35 U.S.C. 154(b) by 230 days.

(21) Appl. No.: 18/821,199

(22) Filed: Aug. 30, 2024

(65) Prior Publication Data

US 2025/0081331 A1 Mar. 6, 2025

(30) Foreign Application Priority Data

Sep. 1, 2023 (CN) ......................... 202311120578.6

(51) Int. Cl.
*H05K 1/02* (2006.01)
*H01P 1/18* (2006.01)

(52) U.S. Cl.
CPC ........... *H05K 1/0242* (2013.01); *H01P 1/184* (2013.01); *H05K 1/024* (2013.01); *H05K 1/0243* (2013.01); *H05K 2201/10098* (2013.01)

(58) Field of Classification Search
CPC ..................... H01B 7/02; H05K 5/247; H05K 2201/10803; H05K 1/141; H05K 1/0246;
(Continued)

(56) References Cited

U.S. PATENT DOCUMENTS 7,463,190 B2 * 12/2008 Zimmerman ............ H01Q 3/32 333/156
11,682,815 B2 * 6/2023 Chen ......................... H01P 1/18 333/24 R (Continued)

FOREIGN PATENT DOCUMENTS

CN 1665071 A 9/2005
CN 103038943 A 4/2013

(Continued)

OTHER PUBLICATIONS

An Office Action dated Oct. 16, 2025 issued in corresponding Taiwan Patent Application No. 113132235 with English translation, 19 pages.

*Primary Examiner* — Timothy J Thompson
*Assistant Examiner* — John B Freal
(74) *Attorney, Agent, or Firm* — MUNCY, GEISSLER, OLDS & LOWE, P.C.

(57) ABSTRACT

The present disclosure discloses a phase shifter including a circuit board, a substrate, and a plurality of cables. Each of the plurality of cables includes a first insulation layer, an outer conductive layer and an inner conductive layer. The outer conductive layer is surrounded by the first insulation layer. The inner conductive layer is spaced apart from the outer conductive layer. The circuit board is electrically connected to the inner conductive layer of each of the plurality of cables. The substrate includes a plurality of tubes for ground, and the circuit board is disposed on the substrate. At least a part of each of the plurality of cables passes through at least one of the plurality of tubes, and the first insulation layer of each of the plurality of cables is positioned between the outer conductive layer and the corresponding tube and forms electrical coupling between the outer conductive layer and the corresponding tube. The present disclosure solves the problem that the process of
(Continued)

connecting the outer conductor of the cable of the existing phase shifter to the printed circuit board is complicated.

20 Claims, 5 Drawing Sheets

(58) Field of Classification Search
CPC ........ H05K 1/142; H05K 1/144; H05K 1/145; H05K 1/0242; H05B 1/0242
See application file for complete search history.

(56) References Cited

U.S. PATENT DOCUMENTS

| | | | | |
|---|---|---|---|---|
| 12,407,099 | B2 * | 9/2025 | Thakur | H01P 1/184 |
| 2022/0006167 | A1 * | 1/2022 | P | H01Q 21/08 |
| 2022/0037753 | A1 * | 2/2022 | Tang | H01P 1/18 |
| 2022/0140459 | A1 * | 5/2022 | Liu | H05K 1/0243<br>333/24 R |
| 2023/0187865 | A1 * | 6/2023 | Toda | H01R 12/732 |
| 2023/0307831 | A1 * | 9/2023 | Li | H01Q 3/32 |
| 2025/0350046 | A1 * | 11/2025 | Yamamoto | H01R 4/02 |

FOREIGN PATENT DOCUMENTS

| | | | |
|---|---|---|---|
| CN | 106972267 | A | 7/2017 |
| CN | 209329165 | U | 8/2019 |
| CN | 112151965 | A | 12/2020 |
| CN | 212392361 | U | 1/2021 |

* cited by examiner

PHASE SHIFTER

FIELD OF THE INVENTION

The present disclosure relates to a technical field of wireless communication, and particularly relates to a phase shifter.

BACKGROUND OF THE INVENTION

In order to achieve that a signal coverage distance may be varied, adjustable electrical components are used to be declined in a base station antenna to achieve different pitch angles of signal radiation. For example, the phase of the phase shifter of the base station antenna may be varied to adjust the slant angle of the signal radiation, and the adjustment of the base station antenna for radiation coverage regions may be further achieved.

The phase shifter includes a cable, a soldering clamp, a printed circuit board and a substrate. The outer conductor of the cable and the soldering clamp are soldered, the soldering clamp and the ground surface on the printed circuit board are soldered and the ground surface on the printed circuit board and the substrate are soldered, thereby achieving that the cable is grounded. However, when the outer conductor of the cable and the soldering clamp are soldered, the process about soldering the outer conductor of the cable and the soldering clamp is complicated and requires more manufacturing time so that the process of connecting the cable to the printed circuit board becomes complicated. Hereby, there is a problem that the process of connecting the outer conductor of the cable of the existing phase shifter to the printed circuit board is complicated.

SUMMARY OF THE INVENTION

The object of the present disclosure is to provide a phase shifter which simplifies the connection between the outer conductor of the cable and the printed circuit board. The phase shifter includes a circuit board, a substrate, and a plurality of cables. Each of the plurality of cables includes a first insulation layer, an outer conductive layer, and an inner conductive layer. The outer conductive layer is surrounded by the first insulation layer. The inner conductive layer is spaced apart from the outer conductive layer. The substrate includes a plurality of tubes for ground, and the circuit board is disposed on the substrate. At least a part of each of the plurality of cables passes through at least one of the plurality of tubes, and the first insulation layer of each of the plurality of cables is positioned between the outer conductive layer and the corresponding tube and forms electrical coupling between the outer conductive layer and the corresponding tube.

In some embodiments, each of the plurality of cables corresponds to the two separate tubes.

In some embodiments, the relationship between each of the plurality of tubes and the corresponding first insulation layer is a transition fit.

In some embodiments, the outer conductive layer of each of the plurality of cables and the corresponding tube form capacitive coupling, and the thickness d of the first insulation layer meets the following formula:

$$\frac{d}{2\pi f \varepsilon_0 \varepsilon_r A} \leq 1$$

wherein, A=2πL, r is the inner diameter of the tube, L is the length of the tube, f is the operating frequency of the capacitor formed by the outer conductive layer, the first insulation layer and the corresponding tube, $\varepsilon_r$ is the relative permittivity of the first insulation layer, and $\varepsilon_0$ is a vacuum permittivity.

In some embodiments, the substrate includes a first substrate and a second substrate connected to the first substrate, and each of the plurality of tubes is disposed on the first substrate.

In some embodiments, the number of the first substrates is multiple, and each of the plurality of first substrates is provided with the plurality of cables and the plurality of tubes.

In some embodiments, the connection between the first substrate and the second substrate is detachable.

In some embodiments, each of the plurality of tubes includes an inner tube, and the first insulation layer is surrounded by the corresponding inner tube. A part of the inner tube is lower than the first substrate so that the inner conductive layer contacts the circuit board along the radial direction of the inner conductive layer.

In some embodiments, the inner tube is the metal layer disposed on the inner sidewall of the tube. Or the inner tube is the inner sidewall of the tube and the materials of the entire tube include metal materials.

In some embodiments, the first insulation layer, the inner tube and the inner conductive layer are coaxially disposed.

In some embodiments, the first substrate includes a plurality of grooves, and each of the plurality of grooves is disposed with each of the plurality of cables one by one. The first insulation layer of each of the plurality of cables contacts the corresponding groove along the radial direction of the first insulation layer. The shape of the first insulation layer of each of the plurality of cables matches the shape of the corresponding groove.

In some embodiments, each of the plurality of grooves corresponds to the two separate tubes and is positioned between the two corresponding separate tubes. Each of the plurality of cables passes through the corresponding groove and the two corresponding separate tubes.

In some embodiments, the circuit board includes a ground layer and a second insulation layer, and the ground layer, the second insulation layer and the second substrate are located in order.

In some embodiments, the phase shifter further includes a phase shifting component disposed on the circuit board. A plurality of microstrips are disposed on the circuit board and are electrically connected to the phase shifting component, and each of the plurality of microstrips is electrically connected to the inner conductive layer of the corresponding cable.

In some embodiments, each of the plurality of cables further includes a third insulation layer positioned between the outer conductive layer and the inner conductive layer. The inner conductive layer extends outwardly from the third insulation layer to the circuit board to form an exposed section of the inner conductive layer, and the exposed section of the inner conductive layer is connected to the microstrip. The third insulation layer extends outwardly from the outer conductive layer to the circuit board to form an exposed section of the third insulation layer, and the exposed section of the third insulation layer contacts the circuit board.

In some embodiments, the outer conductive layer extends outwardly from the first insulation layer to the circuit board to form an exposed section of the outer conductive layer, and the exposed section of the outer conductive layer and the circuit board are spaced apart from each other. The first insulation layer extends outwardly from the corresponding tube to the circuit board to form an exposed section of the first insulation layer, and the exposed section of the first insulation layer and the circuit board are spaced apart from each other.

The present disclosure discloses: the circuit board, the substrate, and the plurality of cables. Each of the plurality of cables includes the first insulation layer, the outer conductive layer, and the inner conductive layer. The outer conductive layer is surrounded by the first insulation layer. The inner conductive layer is spaced apart from the outer conductive layer. The circuit board is electrically connected to the inner conductive layer of each of the plurality of cables. The substrate includes a plurality of tubes for ground, and the circuit board is disposed on the substrate. At least a part of each of the plurality of cables passes through at least one of the plurality of tubes, and the first insulation layer of each of the plurality of cables is positioned between the outer conductive layer and the corresponding tube and forms the electrical coupling between the outer conductive layer and the corresponding tube. Hence, the outer conductive layer, the first insulation layer and the substrate may form a capacitor. The outer conductive layer and the substrate may achieve the capacitive coupling and the ground without connecting the outer conductive layer to the circuit board by soldering, thereby simplifying the connection between the outer conductive layer and the circuit board and reducing the needed manufacturing time.

The aforementioned description of the present disclosure is merely the outline of the technical solutions of the present disclosure. In order to understand the technical solutions of the present disclosure clearly and to implement the present disclosure according to the content of the specification. The better embodiments of the present disclosure given herein below with accompanying drawings are used to describe the present disclosure in detail.

THE DRAWINGS

DETAILED DESCRIPTION

The specific embodiments of the present disclosure given herein below is used to explain the implementation of the present disclosure. A person skilled in the art easily understands the advantages and the effects of the present disclosure from the content of the present disclosure.

It should be noted that the embodiments and the features in the embodiments of the present disclosure can be combined with each other without conflict. The present disclosure will be described in detail below with reference to accompanying drawings and in conjunction with the embodiments. In order to provide those in the art with better understanding of the solution of the disclosure, the technical solutions in the embodiments of the present disclosure will be described clearly and completely below in conjunction with the accompanying drawings in the embodiments of the present disclosure. Apparently, the described embodiments are merely a part of the embodiments of the present disclosure and not all embodiments of the present disclosure. Based on the embodiments of the present disclosure, all other embodiments obtained by a person skilled in the art shall fall within the scope of protection of the present disclosure.

It should be noted that the terms “first”, “second”, etc. in the specification and claims of the present disclosure and in the aforementioned accompanying drawings are used to distinguish similar objects and need not be used to describe a particular order or sequence. Furthermore, the terms “comprising” and “having”, and any variation thereof, are intended to encompass a non-exclusive inclusion, for example, a series of steps or units comprising processes, methods, systems, products or equipment need not be limited to those steps or units clearly listed but may include other steps or units not clearly listed or inherent to those processes, methods, products or equipment.

It should be noted that the terms “mount”, “connect”, “link” should be broadly interpreted, for example, may be a permanent connection, may be a dismountable connection or may be an integral connection; may be a mechanical connection or may be an electrically connection; may be a direct connection, may be a connection by intermediate mediums, or may be an interior connection between two components. For a person skilled in the art, the meaning of the aforementioned terms in the present disclosure may be understood upon specific situations.

Figure 1:
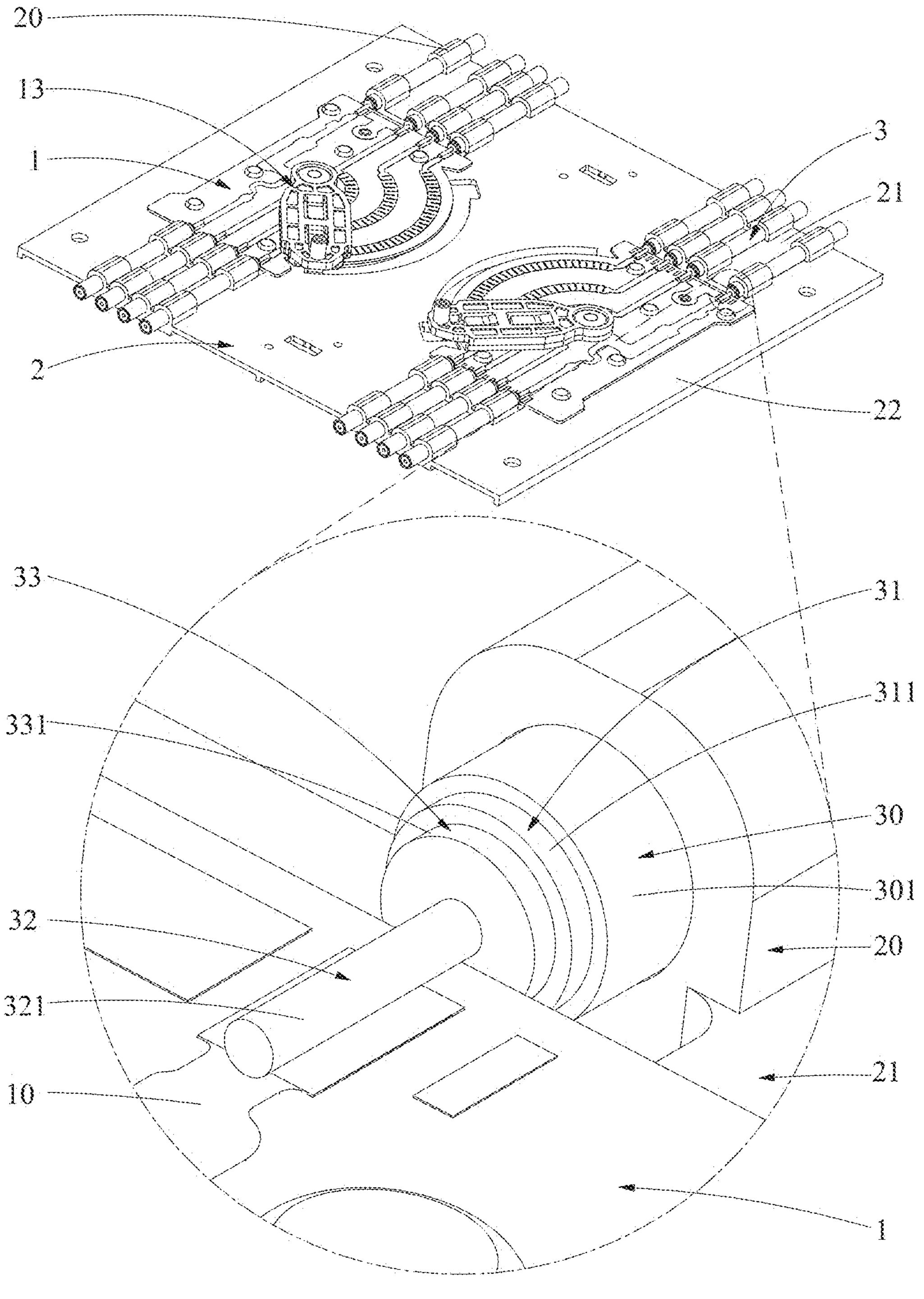
FIG. 1 is a 3D diagram and a partial enlarged diagram of a phase shifter according to one embodiment of the present disclosure.

As shown in FIG. 1, the present disclosure in one embodiment provides a phase shifter including a circuit board 1, a substrate 2 and a plurality of cables 3. Each of the plurality of cables 3 includes a first insulation layer 30, an outer conductive layer 31 and an inner conductive layer 32. The outer conductive layer 31 is surrounded by the first insulation layer 30, and the inner conductive layer 32 is spaced apart from the outer conductive layer 31. The circuit board 1 is electrically connected to the inner conductive layer 32 of each of the plurality of cables 3. The substrate 2 (the substrate 2 may refer to FIG. 1) includes a plurality of tubes 20 for ground, and the circuit board 1 is disposed on the substrate 2, and at least a part of each of the plurality of cables 3 passes through at least one of the plurality of tubes 20. In some embodiments, the materials of one part of the tube 20 or the materials of the entire tube 20 include metal materials, and the tube 20 may be electrically connected to the exterior for ground. The first insulation layer 30 of each of the plurality of cables 3 is positioned between the outer conductive layer 31 and the corresponding tube 20 and forms electrical coupling between the outer conductive layer 31 and the corresponding tube 20 (e.g., forming capacitive coupling). In some embodiments, the materials of one part of the tube 20 or the materials of the entire tube 20 include metal materials, the materials of one part of the substrate 2 or the materials of the entire substrate 2 include metal materials and the tube 20 may be electrically connected to the exterior for ground by the substrate 2.

As shown in FIG. 1, the circuit board 1 may be a printed circuit board (PCB). The configuration of the substrate 2 may refer to the following content in the present embodiment. The cable 3 may be a coaxial cable. The first insulation layer 30 may be the jacket of the cable 3, and the materials of the first insulation layer 30 may include polyvinyl chloride (PVC). The outer conductive layer 31 may be a mesh conductive layer, and the outer conductive layer 31 may be formed by copper mesh and aluminum foil. The inner conductive layer 32 may be copper wires. Each of the first insulation layer 30 may encompass and contacts the corresponding outer conductive layer 31. The outer conductive layer 31 of each of the plurality of cables 3 is surrounded by the corresponding first insulation layer 30, and the outer conductive layer 31 and the inner conductive layer 32 of each of the plurality of cables 3 are spaced apart from each other.

As shown in FIG. 1, the outer conductive layer 31 and the corresponding inner conductive layer 32 may be parallel to each other and be coaxially disposed. The first insulation layer 30 and the outer conductive layer 31 of each of the plurality of cables 3 may be spaced apart from the circuit board 1. The shape of the first insulation layer 30, the shape of the outer conductive layer 31 and the shape of the inner conductive layer 32 may be columns.

As shown in FIG. 1, the outer conductive layer 31 extends outwardly from the first insulation layer 30 to the circuit board 1 to form an exposed section 311 of the outer conductive layer 31, and the exposed section 311 of the outer conductive layer 31 and the circuit board 1 are spaced apart from each other. The shape of the exposed section 311 of the outer conductive layer 31 may be a cylinder. The end surface of the exposed section 311 of the outer conductive layer 31 may be disposed in parallel with the side surface of the circuit board 1. The first insulation layer 30 extends outwardly from the corresponding tube 20 to the circuit board 1 to form an exposed section 301 of the first insulation layer 30, and the exposed section 301 of the first insulation layer 30 and the circuit board 1 are spaced apart from each other. The shape of the exposed section 301 of the first insulation layer 30 may be a cylinder, and the end surface of the exposed section 301 of the first insulation layer 30 may be disposed in parallel with the side surface of the circuit board 1. The length of the exposed section 301 of the first insulation layer 30 is less than the length of the exposed section 311 of the outer conductive layer 31.

As shown in FIG. 1, a plurality of microstrips 10 are disposed on the circuit board 1, and the plurality of microstrips 10 are disposed on the upper surface of the circuit board 1. Each of the plurality of microstrips 10 is connected to the inner conductive layer 32 of the corresponding cable 3 (for example, each of plurality of microstrips 10 and the inner conductive layer 32 of each of the plurality of cables 3 are disposed one by one and are electrically connected with each other). In some embodiments, the inner conductive layer 32 of each of the plurality of cables 3 may be fixed on the corresponding microstrip 10 by soldering or pressure soldering. The phase shifter further includes a phase shifting component 13 disposed on the circuit board 1 and electrically connected to the plurality of microstrips 10. The shifting component 13 is configured to adjust a phase of a signal.

As shown in FIG. 1, the cable 3 further includes a third insulation layer 33 positioned between the outer conductive layer 31 and the inner conductive layer 32. The inner conductive layer 32 extends outwardly from the third insulation layer 33 to the circuit board 1 to form an exposed section 321 of the inner conductive layer 32, and the exposed section 321 of the inner conductive layer 32 is connected to the microstrip 10 (for example, the exposed section 321 of the inner conductive layer 32 is fixed on the corresponding microstrip 10 by soldering or pressure soldering). The third insulation layer 33 extends outwardly from the outer conductive layer 31 to the circuit board 1 to form an exposed section 331 of the third insulation layer 33, and the exposed section 331 of the third insulation layer 33 contacts the circuit board 1. The top of the exposed section 331 of the third insulation layer 33 may contact the side surface of the circuit board 1. The materials of the third insulation layer 33 may include polytetrafluoroethene (PTFE). The shape of the third insulation layer 33 may be a cylinder. The shape of the exposed section 331 of the third insulation layer 33 may be a cylinder. The length of the exposed section 311 of the outer conductive layer 31 is less than the length of the exposed section 331 of the third insulation layer 33. The exposed section 331 of the third insulation layer 33 contacts the circuit board 1, and the position during the connection between the cable 3 and the circuit board 1 is achieved without assistance of a soldering clamp 5 (the soldering clamp 5 may refer to FIG. 2) so that the cost of the position during the connection between the cable 3 and the circuit board 1 would be reduced and the position during the connection between the cable 3 and the circuit board 1 would be convenient. For example, when the cable 3 passes through the tube 2 and the exposed section 331 of the third insulation layer 33 of the cable 3 contacts the circuit board 1, it indicates that the cable 3 has been positioned.

The present disclosure discloses: the circuit board 1, the substrate 2, and the plurality of cables 3. Each of the plurality of cables 3 includes the first insulation layer 30, the outer conductive layer 31, and the inner conductive layer 32. The outer conductive layer 31 is surrounded by the first insulation layer 30. The inner conductive layer 32 is spaced apart from the outer conductive layer 31. The circuit board 1 is electrically connected to the inner conductive layer 32 of each of the plurality of cables 3. The substrate 2 includes a plurality of tubes 20 for ground, and the circuit board 1 is disposed on the substrate 2. At least a part of each of the plurality of cables 3 passes through at least one of the plurality of tubes 20, and the first insulation layer 30 of each of the plurality of cables 3 is positioned between the outer conductive layer 31 and the corresponding tube 20 and forms the electrical coupling between the outer conductive layer 31 and the corresponding tube 20. Hence, the outer conductive layer 31, the first insulation layer 30 and the substrate 2 may form the capacitor. The outer conductive layer 31 and the substrate 2 may achieve the capacitive coupling and ground without connecting the outer conductive layer 31 to the circuit board 1 by soldering, thereby simplifying the connection between the outer conductive layer 31 and the circuit board 1 and reducing the needed manufacturing time. Besides, the first insulation layer 30 is an inherent structure in the cable 3, and there is no requirement for placing another insulation sheet between the outer conductive layer 31 and substrate 2 to form the capacitor so that the structure of the capacitor is simpler.

Figure 2:
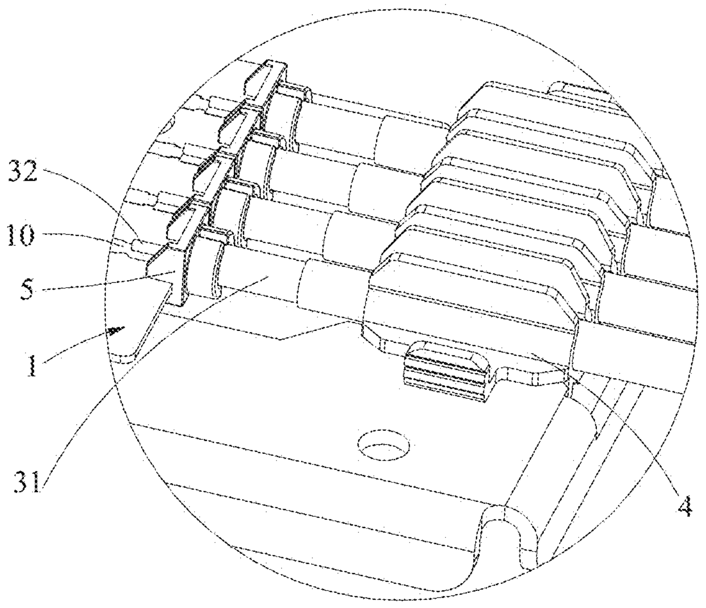
FIG. 2 is a 3D diagram and a partial enlarged diagram of a phase shifter in the associated technical embodiments.

As shown in FIG. 2, in the associated technical embodiments, the cable 3 (the cable 3 may refer to FIG. 1, similarly hereinafter) is clamped by the cable clamp 4. The outer conductive layer 31 of the cable 3 is soldered on the soldering clamp 5, and the inner conductive layer 32 of the cable 3 is soldered on the microstrip 10 of the front surface of the circuit board 1. The soldering clamp 5 is connected to the ground of the back surface of the circuit board 1 by soldering so that the outer conductive layer 31 is grounded. By the aforementioned connection for ground, the outer conductive layer 31 of the cable 3 requires the soldering clamp 5 to be connected to the ground of the back surface of the circuit board 1. In other words, the outer conductive layer 31 needs to be soldered on the soldering clamp 5 to achieve the connection between the outer conductive layer 31 and the ground of the circuit board 1. Hence, the connection between the outer conductive layer 31 and the circuit board 1 needs more soldering.

Figure 3:
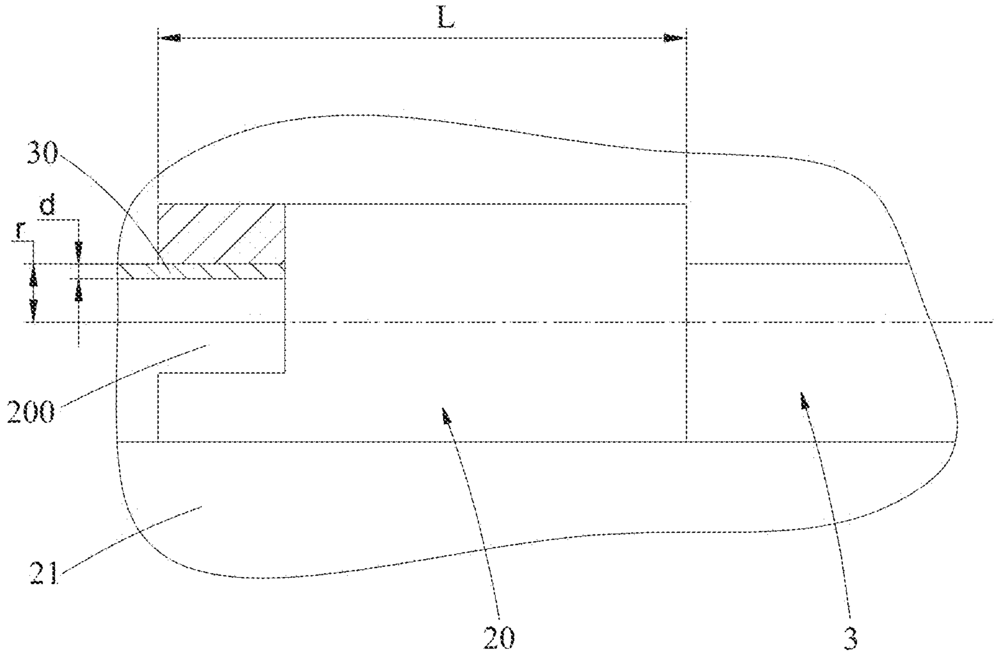
FIG. 3 is a partial enlarged diagram of a cable, a tube and a first substrate according to one embodiment of the present disclosure (omitting the outer conductive layer, the inner conductive layer and the third insulation layer of the cable and partially sectioning the tube and the first insulation layer of the cable).

As shown in FIG. 3, optionally, each of the plurality of cables 3 corresponds to two separate tubes, and the first insulation layer 30 of each of the plurality of cables 3 passes through the corresponding tube 20. For example, the first insulation layer 30 of each of the plurality of cables 3 passes through the corresponding tube 20 along the axial line of the corresponding tube 20, and in other words, the first insulation layer 30 of each of the plurality of cables 3 and the corresponding tube 20 may be coaxially disposed. The inner wall of each of the plurality of tubes 20 may encompass and contact the section on the first insulation layer 30 of which the length is equal to the length of the tube 20. The shape of the tube 20 may be a cylinder. The relationship between each of the plurality of tubes 20 and the corresponding first insulation layer 30 is a transition fit. The transition fit denotes that the relationship between the inner wall of each of the plurality of tubes 20 and the outer surface of the corresponding first insulation layer 30 may be an interference fit or a clearance fit.

As shown in FIG. 3, optionally, the outer conductive layer 31 of each of the plurality of cables 3 and the corresponding tube 20 form the capacitive coupling, and the thickness d of the first insulation layer 30 meets the following formula:

$$\frac{d}{2\pi f\varepsilon_0\varepsilon_r A} \leq 1$$

A=2πrL, wherein r is the inner diameter of the tube 20, L is the length of the tube 20, and in other words, A is the coupling area of the capacitor formed by the outer conductive layer 31 (the outer conductive layer 31 may refer to FIG. 1, similarly hereinafter), the first insulation layer 30 and the tube 20. f is the operating frequency of the capacitor formed by the outer conductive layer 31, the first insulation layer 30 and the corresponding tube 20, $\varepsilon_r$ is the relative permittivity of the first insulation layer 30, and $\varepsilon_0$ is a vacuum permittivity and $\varepsilon_0=8.85\times10^{-12}$ F/m. When the materials of the first insulation layer 30 include PVC, $\varepsilon_r=4.0$. The reactance X of the capacitor formed by the outer conductive layer 31, the first insulation layer 30 and the tube 20 is $$X = \frac{1}{2\pi fC}.$$

When the value of the capacitor C is infinite, X=0 and the capacitor C may be regarded as a complete short circuit. In the actual use, when X≤1, the better effect of the short circuit may be obtained. Because the value of the capacitor C is $$C = \frac{\varepsilon_r\varepsilon_0 A}{d},$$

the following formulas needs to be met to obtain the better effect of the short circuit effect and the better effect of the ground coupling:

$$\frac{d}{2\pi f\varepsilon_0\varepsilon_r A} \leq 1$$

Figure 4:
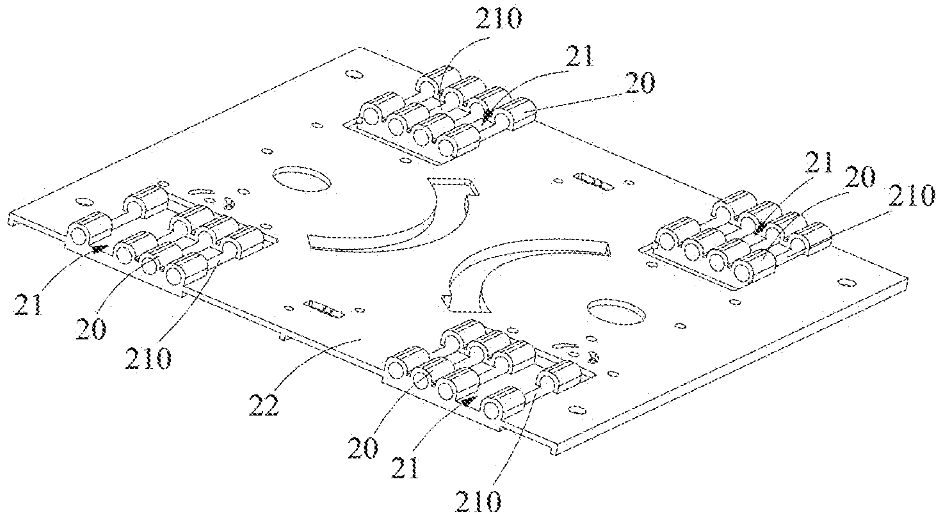
FIG. 4 is a 3D diagram of a first substrate and a second substrate (which are connected) according to one embodiment of the present disclosure.

As shown in FIG. 4, optionally, the substrate 2 (the substrate 2 may refer to FIG. 1) further includes a first substrate 21 and a second substrate 22 connected to the first substrate 21, and each of the plurality of tubes 20 is disposed on the first substrate 21. The shape of the first substrate 21 and the shape of the second substrate 22 may be cuboid sheets, the number of the first substrates 21 may be four and the number of the second substrate 22 may be one. The four first substrates 21 may be respectively disposed on four corners of the second substrate 22, and each of the four first substrates 21 may be disposed in parallel with each other. The plurality of tubes 20 may be fixed on the four first substrates 21 by soldering or one-piece molding. The materials of each of the plurality of tubes 20, each of the four first substrates 21 and the second substrate 22 may include conductive metal materials (e.g., aluminum alloy). The four first substrates 21 may be connected to the second substrate 22 by soldering or one-piece molding.

As shown in FIG. 4, optionally, the number of the first substrates 21 is multiple, and the plurality of cables 3 (the cable 3 may refer to FIG. 1, similarly hereinafter) and the plurality of tubes 20 are disposed on the plurality of first substrates 21. The group number of the first substrates 21 is two, and the number of the circuit board 1 (the circuit board 1 may refer to FIG. 1, similarly hereinafter) is two. Each of the two circuit boards 1 is correspondingly disposed with one group of first substrates 21, each of the two groups of first substrates 21 includes two first substrates 21 and each of the two circuit boards 1 is positioned between the two first substrates 21 of the corresponding group of first substrates 21. The number of the first substrates 21 may be four. Four cables 3 and eight tubes 20 may be disposed on one first substrate 21, each of the four cables 3 passes through two tubes 20 and the two tubes 20 which provide each of the four cables 3 to pass through may be coaxially disposed. Each of the four cables 3 may be disposed in parallel with each other, and each of the eight tubes 20 may be disposed in parallel with each other.

Because the number of the cables 3 is large, the outer conductive layer 31 of each of the cables 3 and the soldering clamp 5 do not need to be soldered after the outer conductive layer 31 of each of the cables 3 is grounded by using the capacitive coupling in the present embodiment, and the large soldering to connect the outer conductive layer 31 and the soldering clamp 5 may be omitted. When the number of cables 3 is more, the advantage of the saved amount of soldering to connect the outer conductive layer 31 and the soldering clamp 5 by using the capacitive coupling in the present embodiment would be obvious.

Figure 5:
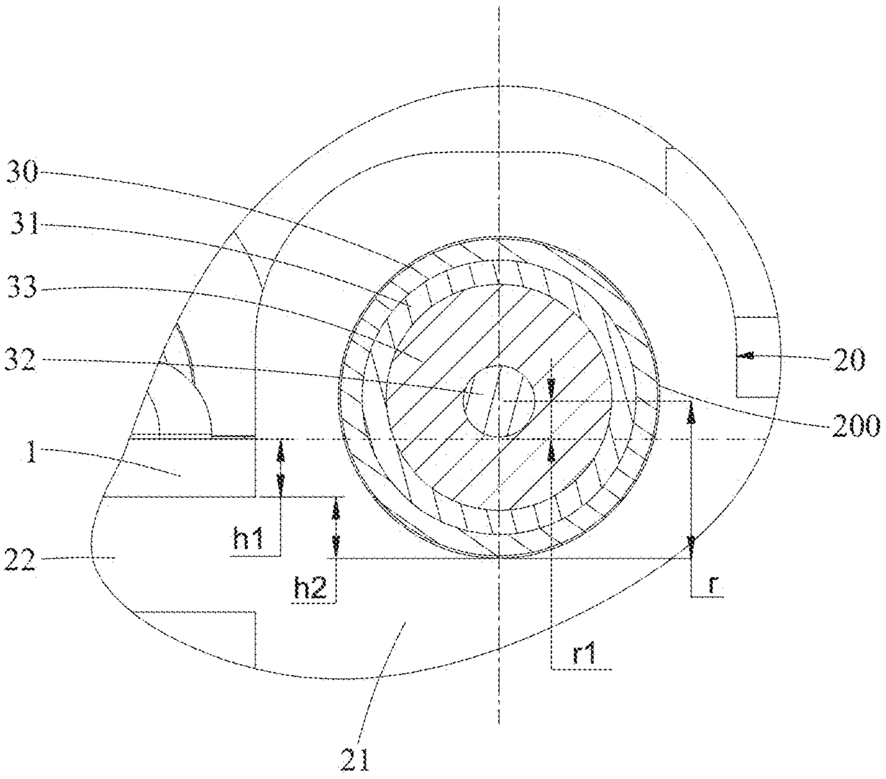
FIG. 5 is a partial enlarged diagram of a front view diagram of a cable, a tube, a first substrate, a second substrate and a circuit board according to one embodiment of the present disclosure (sectioning the cable).

As shown in FIG. 5, optionally, the tube 20 includes an inner tube 200, the first insulation layer 30 is surrounded by the corresponding inner tube 200, and a part of the inner tube 200 is lower than the first substrate 21 so that the inner conductive layer 32 contacts the circuit board 1 along the radial direction of the inner conductive layer 32. The first insulation layer 30, the inner tube 200 and the inner conductive layer 32 are coaxially disposed. Each of the plurality of inner tubes 200 may encompass and contact the section on the corresponding first insulation layer 30 of which the length is equal to the length of the inner tube 200. The shape of inner tube 200 may be a cylinder, the inner tube 200 is an inner surface of the tube 20 and the bottom of the inner tube 200 may be lower than the upper surface of the first substrate 21. In some embodiments, the inner tube 200 may be a metal layer disposed on the inner sidewall of the tube 20. In some embodiments, the inner tube 200 is the inner sidewall of the tube 20 and the materials of the entire tube 20 include metal materials.

As shown in FIG. 5, for example, when the thickness of the circuit board 1 is denoted as h1, the bottom of the circuit board 1 contacts the upper surface of the second substrate 22, and the upper surface of the first substrate 21 and the upper surface of the second substrate 22 are coplanar. The radius of the first insulation layer 30 is denoted as r (i.e., the radius of the first insulation layer 30 is equal to the inner diameter of the tube 20), and the radius of inner conductive layer 32 is denoted as r1. The height between the lowest point of the inner tube 200 and the upper surface of the second substrate 22 is denoted as h2, and the inner conductive layer 32 contacts the upper surface of the circuit board 1 along the radial direction of the inner conductive layer 32 when h2=r−h1−r1 (the dotted line in FIG. 5 is the upper surface of the circuit board 1).

As shown in FIG. 5, one part of the inner tube 200 is lower than the first substrate 21 so that the inner conductive layer 32 contacts the circuit board 1 along the radial direction of the inner conductive layer 32, and the inner conductive layer 32 may contact the circuit board 1 along the radial direction of the inner conductive layer 32 after the cable 3 (the cable 3 may refer to FIG. 1, similarly hereinafter) passes through the inner tube 200 and arrives the circuit board 1. In this way, when the inner conductive layer 32 is connected to the circuit board 1, there is no requirement for making more adjustments on the inner conductive layer 32 (for example, there is no need to bend the inner conductive layer 32) so that the connection between the inner conductive layer 32 of the cable 3 and the circuit board 1 is more convenient. For example, when the inner conductive layer 32 arrives the circuit board 1, the inner conductive layer 32 contacts the microstrip 10 (the microstrip 10 may refer to FIG. 1, similarly hereinafter) of the circuit board 1 along the radial direction of the inner conductive layer 32 so that there is no requirement for bending the inner conductive layer 32 to contact the microstrip 10. Because the inner conductive layer 32 has contacted the microstrip 10, the inner conductive layer 32 may be directly soldered on the microstrip 10 and the process of adjusting the shape or the position of the inner conductive layer 32 to contact the circuit board 1 is omitted.

Figure 6:
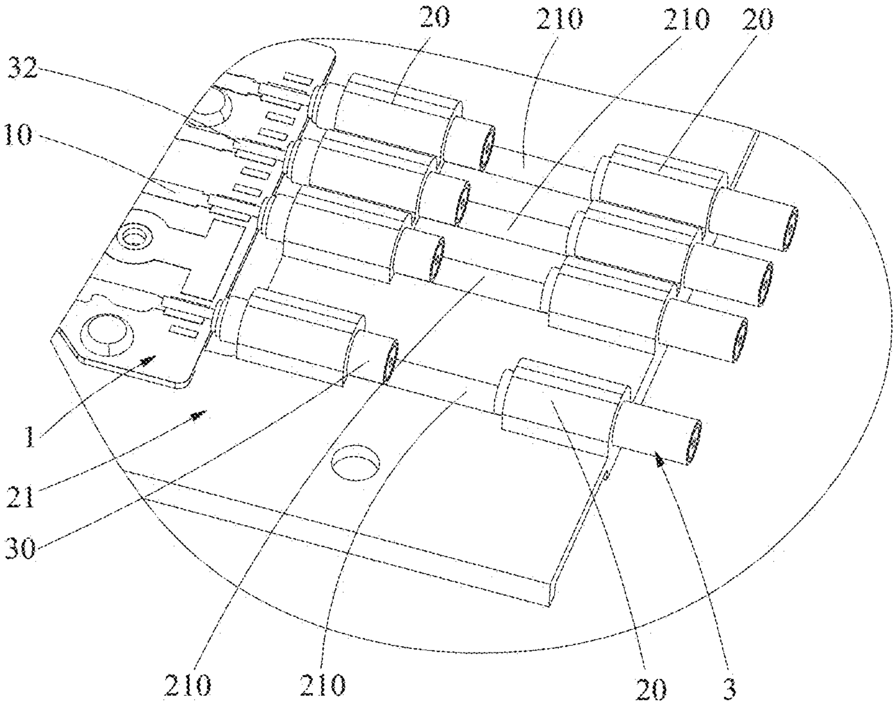
FIG. 6 is a partial enlarged diagram of a 3D diagram of cables, a tube, a first substrate and a circuit board according to one embodiment of the present disclosure (cutting off each of the cables).

As shown in FIG. 6, optionally, the first substrate 21 includes a plurality of grooves 210. Each of the plurality of grooves 210 is disposed with each of the plurality of cables 3 one by one, the first insulation layer 30 of each of the plurality of cables 3 contacts the corresponding groove 210 along the radial direction of the first insulation layer 30 and the shape of the first insulation layer 30 of each of the plurality of cables 3 matches the shape of the corresponding groove 210. The first insulation layer 30 may contact the corresponding groove 210 along the radial direction of the first insulation layer 30. The shape of the first insulation layer 30 of each of the plurality of cables 3 matches the shape of the corresponding groove 210, and it indicates that the shape of the circumferential surface of the first insulation layer 30 may be the same as the shape of the circumferential surface of the groove 210. For example, the shape of the circumferential surface of the first insulation layer 30 is a column and the shape of the circumferential surface of the groove 210 is a partial column so that the shape of the circumferential surface of the first insulation layer 30 of each of the plurality of cables 3 may match the shape of the circumferential surface of the corresponding groove 210 when the radius of the circumferential surface of the first insulation layer 30 is equal to the radius of the circumferential surface of the groove 210. The shape of the first insulation layer 30 of each of the plurality of cables 3 matches the shape of the corresponding groove 210 so that there are more areas on the first insulation layer 30 to contact the substrate 2 (the substrate 2 may refer to FIG. 1, similarly hereinafter), and the former may increase coupling areas in comparison with that the first insulation layer 30 is directly disposed on the flat substrate.

As shown in FIG. 6, optionally, the shape of each of the plurality of grooves 210 exhibits a partial cylinder, and the radius of each of the plurality of grooves 210 is equal to the outer diameter of the corresponding first insulation layer 30. The partial cylinder groove 210 may be formed by sectioning a cylinder surface from the plane parallel to the axial line of the inner tube 200 (the inner tube 200 may refer to FIG. 5). The shape of each of the plurality of grooves 210 exhibits a partial cylinder and the radius of each of the plurality of grooves 210 is equal to the outer diameter of the corresponding first insulation layer 30 so that the first insulation layer 30 may fully contact the groove 210. Each of the plurality of grooves 210 are disposed in parallel with each other.

As shown in FIG. 6, optionally, each of the plurality of grooves 210 corresponds to the two separate tubes 20 and is positioned between the two corresponding separate tubes 20, and each of the plurality of cables 3 passes through the corresponding groove 210 and the two corresponding separate tubes 20. In comparison with that the cable 3 passes one long tube, each of the plurality of cables 3 passes through the corresponding groove 210 and the two corresponding separate tubes 20 and it is convenient for the wire end of the cable 3 to pass through. Specifically, when the relationship between the first insulation layer 30 of the cable 3 and the tube 20 is the interference fit, it is not easy for the cable 3 to pass through the tube 20. The two short and separate tubes 20 are used and the one longer tube is not used, and it may be easier for the wire end of the cable 3 to pass through the tube 20 because the cooperation length between the cable 3 and the short tube 20 of the first insulation layer 30 is shorter. When the wire end of the cable 3 to pass through one of the two separate tubes 20, an external force may be applied to the space between the two separate tubes 20 to pull the cable 3 for helping the cable 3 pass through the other tube 20 (for example, the fingers may be used to seize the wire end of the cable 3 on the space between the two separate tubes 20 to pull the cable 3).

As shown in FIG. 6, optionally, each of the plurality of grooves 210 and the two corresponding separate tubes 20 are coaxially disposed, each of the plurality of grooves 210 is connected to the two corresponding separate tubes 20 and the radius of each of the plurality of grooves 210 is equal to the inner diameter of each of the two corresponding separate tubes 20. The radius of each of the plurality of grooves 210 may be equal to the radius of each of the two corresponding separate tubes 20 which are coaxially disposed with the groove 210. Each of the plurality of grooves 210 is connected to the two corresponding separate tubes 20 and the radius of each of the plurality of grooves 210 is equal to the inner diameter of each of the two corresponding separate tubes 20 so that each of the plurality of grooves 210 guides the cable 3 passing through the two separate tubes 20, and it is convenient for the cable 3 to pass through the two separate tubes 20 without deviation. In other words, after the cable 3 passes through one of the two separate tubes 20, the cable 3 continues to go forward the other tube of the two separate tubes 20 by the groove 210 between the two separate tubes 20.

Figure 7:
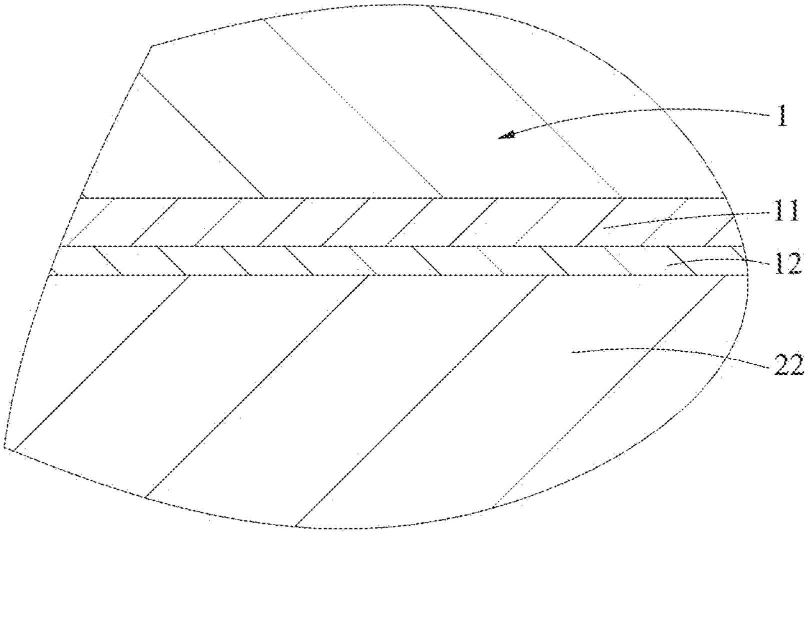
FIG. 7 is an enlarged diagram of a partial section of a circuit board and a second substrate according to one embodiment of the present disclosure.

As shown in FIG. 7, optionally, the circuit board 1 includes a ground layer 11 and a second insulation layer 12, and the ground layer 11, the second insulation layer 12 and the second substrate 22 are located in order. The second insulation layer 12 may be a solder mask layer disposed on the bottom of the circuit board 1. The ground layer 11 may be metal ground, and for example, the materials of the ground layer 11 may include copper. The configuration of the ground layer 11, the second insulation layer 12 and the second substrate 22 may also form the capacitor so that the electromagnetic wave on the circuit board 1 may be transmitted to the second substrate 22 by the effect of the capacitor.

Figure 8:
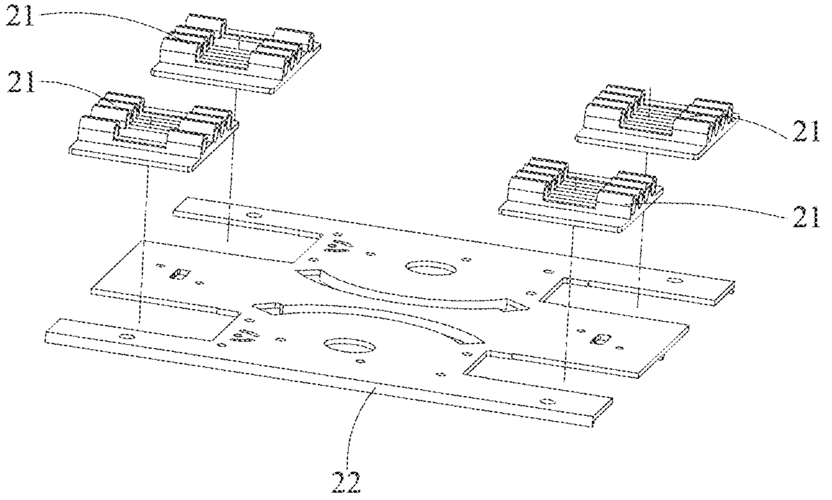
FIG. 8 is an exploded view diagram of a first substrate and a second substrate according to another embodiment of the present disclosure.

As shown in FIG. 8, optionally, the connection between the first substrate 21 and the second substrate 22 in another embodiment is detachable. For example, the first substrate 21 may be detachably connected to the second substrate 22 by screws or rivets. In comparison with that the plurality of cables 3 (the cable 3 may refer to FIG. 1, similarly hereinafter) are disposed on the entire substrate with big areas, the connection between the first substrate 21 and the second substrate 22 is detachable and it only needs to replace the corresponding first substrate with a smaller area when the number of the cables changes (for example, when the apparatus of the phase shifter needs upgrading and the number of the cables needs changing), and there is no requirement for replacing the entire substrate with a larger area, thereby reducing the cost of replacing the substrate.

The phase shifter provided by the embodiments of the present disclosure is described in detail by the above description. The person skilled in the art would have changes in specific implementation and application scope according to the idea of the embodiments of the present disclosure. In view of the above description, the content of the present disclosure should not be construed as limitations of the present disclosure, and equivalent modification or changes according to the idea and the spirit of the present disclosure should be construed as being included within the claims of the present disclosure.

LIST OF REFERENCE SIGNS

1: circuit board
10: microstrip
11: ground layer
12: second insulation layer
2: substrate
13: phase shifting component
20: tube
200: inner tube
21: first substrate
210: groove
22: second substrate
3: cable
30: first insulation layer
301: exposed section of the first insulation layer
31: outer conductive layer
311: exposed section of the outer conductive layer
32: inner conductive layer
321: exposed section of the inner conductive layer
33: third insulation layer
331: exposed section of the third insulation layer
4: cable clamp
5: soldering clamp
d: thickness of the first insulation layer
r: inner diameter of the tube
L: length of the tube
h1: thickness of the circuit board
r1: radius of the inner conductive layer
h2: height between the lowest point of the inner tube and the upper surface of the second substrate

The invention claimed is:

1. A phase shifter comprising:
a plurality of cables, each of which comprising:
a first insulation layer;
an outer conductive layer surrounded by the first insulation layer; and
an inner conductive layer spaced apart from the outer conductive layer;
a circuit board electrically connected to the inner conductive layer of each of the plurality of cables; and
a substrate comprising a plurality of tubes for ground, wherein the circuit board is disposed on the substrate, at least a part of each of the plurality of cables passes through at least one of the plurality of tubes, and the first insulation layer of each of the plurality of cables is positioned between the outer conductive layer and the corresponding tube and forms electrical coupling between the outer conductive layer and the corresponding tube.

2. The phase shifter according to claim 1, wherein each of the plurality of cables corresponds to two separate tubes.

3. The phase shifter according to claim 1, wherein a relationship between each of the plurality of tubes and the corresponding first insulation layer is a transition fit.

4. The phase shifter according to claim 1, wherein the outer conductive layer of each of the plurality of cables and the corresponding tube form capacitive coupling, and a thickness d of the first insulation layer meets a following formula:

$$\frac{d}{2\pi f \varepsilon_0 \varepsilon_r A} \leq 1$$

wherein, A=2πrL, r is an inner diameter of the tube, L is a length of the tube, f is an operating frequency of a capacitor formed by the outer conductive layer, the first insulation layer and the corresponding tube, $\varepsilon_r$ is a relative permittivity of the first insulation layer, and $\varepsilon_0$ is a vacuum permittivity.

5. The phase shifter according to claim 1, wherein the substrate comprises a first substrate and a second substrate connected to the first substrate, and each of the plurality of tubes is disposed on the first substrate.

6. The phase shifter according to claim 5, wherein a number of the first substrates is multiple, and each of the plurality of first substrates is provided with the plurality of cables and the plurality of tubes.

7. The phase shifter according to claim 5, wherein a connection between the first substrate and the second substrate is detachable.

8. The phase shifter according to claim 5, wherein each of the plurality of tubes comprises an inner tube, the first insulation layer is surrounded by the corresponding inner tube, and a part of the inner tube is lower than the first substrate so that the inner conductive layer contacts the circuit board along a radial direction of the inner conductive layer.

9. The phase shifter according to claim 8, wherein the inner tube is a metal layer disposed on an inner sidewall of the tube; or the inner tube is the inner sidewall of the tube and materials of the entire tube comprise metal materials.

10. The phase shifter according to claim 8, wherein the first insulation layer, the inner tube and the inner conductive layer are coaxially disposed.

11. The phase shifter according to claim 5, wherein the first substrate comprises a plurality of grooves, each of the plurality of grooves is disposed with each of the plurality of cables one by one, the first insulation layer of each of the plurality of cables contacts the corresponding groove along a radial direction of the first insulation layer, and a shape of the first insulation layer of each of the plurality of cables matches a shape of the corresponding groove.

12. The phase shifter according to claim 11, wherein each of the plurality of grooves corresponds to two separate tubes and is positioned between the two corresponding separate tubes, and each of the plurality of cables passes through the corresponding groove and the two corresponding separate tubes.

13. The phase shifter according to claim 5, wherein the circuit board comprises a ground layer and a second insulation layer, and the ground layer, the second insulation layer and the second substrate are located in order.

14. The phase shifter according to claim 1, further comprising a phase shifting component disposed on the circuit board, wherein a plurality of microstrips are disposed on the circuit board and are electrically connected to the phase shifting component, and each of the plurality of microstrips is electrically connected to the inner conductive layer of the corresponding cable.

15. The phase shifter according to claim 14, wherein each of the plurality of cables further comprises a third insulation layer positioned between the outer conductive layer and the inner conductive layer, the inner conductive layer extends outwardly from the third insulation layer to the circuit board to form an exposed section of the inner conductive layer, and the exposed section of the inner conductive layer is connected to the microstrip; the third insulation layer extends outwardly from the outer conductive layer to the circuit board to form an exposed section of the third insulation layer, and the exposed section of the third insulation layer contacts the circuit board.

16. The phase shifter according to claim 15, wherein the outer conductive layer extends outwardly from the first insulation layer to the circuit board to form an exposed section of the outer conductive layer, and the exposed section of the outer conductive layer and the circuit board are spaced apart from each other; the first insulation layer extends outwardly from the corresponding tube to the circuit board to form an exposed section of the first insulation layer, and the exposed section of the first insulation layer and the circuit board are spaced apart from each other.

17. The phase shifter according to claim 5, wherein a number of the first substrate is four, the four first substrates are respectively disposed at four corners of the second substrate, wherein the four first substrates are disposed in parallel with each other, and a number of the circuit board is two, each of the two circuit boards is positioned between two corresponding first substrates among the four first substrates.

18. The phase shifter according to claim 5, wherein the bottom of the circuit board contacts an upper surface of the second substrate, and an upper surface of the first substrate and the upper surface of the second substrate are coplanar.

19. The phase shifter according to claim 11, wherein each of the plurality of tubes comprises an inner tube, each of the plurality of grooves comprises a partial-cylindrical shape formed by sectioning a cylinder surface from a plane parallel to an axial line of the inner tube.

20. The phase shifter according to claim 16, wherein a length of the exposed section of the first insulation layer is less than a length of the exposed section of the outer conductive layer, and the length of the exposed section of the outer conductive layer is less than a length of the exposed section of the third insulation layer.

* * * * *